(12) United States Patent
Kim et al.

(10) Patent No.: US 8,174,324 B2
(45) Date of Patent: May 8, 2012

(54) DIGITAL PHASE DETECTOR, AND DIGITAL PHASE LOCKED LOOP INCLUDING THE SAME

(75) Inventors: Tae-Wook Kim, Suwon-si (KR);
Hee-Mun Bang, Seoul (KR);
Heung-Bae Lee, Seongnam-si (KR)

(73) Assignee: Samsung Electronics Co., Ltd., Suwon-Si (KR)

( * ) Notice: Subject to any disclaimer, the term of this patent is extended or adjusted under 35 U.S.C. 154(b) by 138 days.

(21) Appl. No.: 12/718,509

(22) Filed: Mar. 5, 2010

(65) Prior Publication Data

US 2010/0237953 A1 Sep. 23, 2010

(30) Foreign Application Priority Data

Mar. 17, 2009 (KR) ........................ 10-2009-0022587

(51) Int. Cl.
*H03L 7/00* (2006.01)
(52) U.S. Cl. ............... 331/1 A; 331/57; 331/25; 331/16; 327/156
(58) Field of Classification Search .................... 331/57, 331/1 A, 25, 16; 327/156
See application file for complete search history.

(56) References Cited

U.S. PATENT DOCUMENTS

| 7,095,353 | B2 | 8/2006 | Sander et al. |
| 7,332,973 | B2 | 2/2008 | Lee et al. |
| 7,352,831 | B2 | 4/2008 | Quinlan et al. |
| 2006/0171495 | A1 | 8/2006 | Youssouflan |
| 2008/0315921 | A1* | 12/2008 | Cha et al. ..................... 327/42 |

* cited by examiner

*Primary Examiner* — Arnold Kinkead
(74) *Attorney, Agent, or Firm* — F. Chau & Associates, LLC

(57) ABSTRACT

A digital phase detector includes a quantization unit that quantizes a frequency of a reference signal to generate reference delay information and reference integer phase information, and quantizes a frequency of an oscillation signal to generate oscillation delay information and oscillation integer phase information. A first conversion unit converts the frequency of the reference signal into reference frequency information based upon the reference delay information and the reference integer phase information. A second conversion unit converts the frequency of the oscillation signal into oscillation frequency information based upon the oscillation delay information and the oscillation integer phase information. A calculation unit converts the reference frequency information and the oscillation frequency information into first and second phase information, respectively, and outputs a digital phase difference between the first phase information and the second phase information.

15 Claims, 9 Drawing Sheets

FIG. 2B

DIGITAL PHASE DETECTOR, AND DIGITAL PHASE LOCKED LOOP INCLUDING THE SAME

CROSS-REFERENCE TO RELATED APPLICATION

This application claims under 35 USC §119 priority to and the benefit of Korean Patent Application No. 2009-0022587, filed on Mar. 17, 2009, in the Korean Intellectual Property Office (KIPO), the entire content of which is incorporated by reference herein.

BACKGROUND

1. Technical Field

The present disclosure relates to phase locked loops, and, more particularly, to a digital phase detector and a digital phase locked loop including the same.

2. Discussion of the Related Art

Generally, a phase locked loop is used to output a signal having a locked phase. A conventional phase locked loop is implemented by analog circuits that include a phase frequency detector, a charge pump, a loop filter, a voltage controlled oscillator, and a divider. However, the conventional analog phase locked loop may provide low accuracy and have high sensitivity to external noises.

To avoid these analog circuit issues, a digital phase locked loop has been implemented by digital circuits. Usually, in the digital phase locked loop, a digital frequency detector corresponding to the phase frequency detector of the analog phase locked loop is used. However, when a large size digital frequency detector is implemented it consumes high power, and the resultant digital phased locked loop can, in turn, become large in size and consume high power.

SUMMARY

Exemplary embodiments of the inventive concept provide a digital phase detector that may be implemented in small size, may consume low power, and may accurately detect a phase difference between a reference signal and an oscillation signal.

Exemplary embodiments of the inventive concept also provide a digital phase locked loop including the digital phase detector that may be implemented in small size, and may accurately lock a phase of an oscillation signal.

According to an exemplary embodiment, a digital phase detector includes a quantization unit configured to quantize a frequency of a reference signal to generate reference delay information and reference integer phase information, and configured to quantize a frequency of an oscillation signal to generate oscillation delay information and oscillation integer phase information. A first conversion unit is configured to convert the frequency of the reference signal into reference frequency information based upon the reference delay information and the reference integer phase information. A second conversion unit is configured to convert the frequency of the oscillation signal into oscillation frequency information based upon the oscillation delay information and the oscillation integer phase information, and a calculation unit is configured to convert the reference frequency information into first phase information, is configured to convert the oscillation frequency information into second phase information, and is configured to output a digital phase difference between the first phase information and the second phase information.

The quantization unit may include a ring oscillator configured to generate a reference passing signal, an oscillation passing signal, and a clock signal based upon the reference signal and the oscillation signal, a first latch block configured to generate the reference delay information based upon the reference signal and the reference passing signal, a second latch block configured to generate the oscillation delay information based upon the oscillation signal and the oscillation passing signal, and a counter block configured to count the clock signal to generate the reference integer phase information and the oscillation integer phase information.

The first conversion unit may generate reference fraction phase information based upon the reference delay information, and may generate reference phase information by adding the reference fraction phase information to the reference integer phase information.

The first conversion unit may include a first edge detection block configured to generate a reference position signal based upon the reference delay information, a first encoder block configured to generate the reference fraction phase information based upon the reference position signal, a first adder block configured to generate the reference phase information by adding the reference fraction phase information to the reference integer phase information, and a first differentiation block configured to perform a differentiation operation on the reference phase information to generate the reference frequency information.

The first conversion unit may convert the frequency of the reference signal into the reference frequency information using:

$$dF_{REF}(n) = \frac{F_{OSC}}{F_{REF}} = CNT_R(n) - CNT_R(n-1) - 1 + fr_R(n) + 1 - fr_R(n-1)$$

where $dF_{REF}(n)$ denotes reference frequency information detected at (n)th rising edge, $F_{OSC}$ denotes a frequency of a clock signal, $F_{REF}$ denotes a frequency of a reference signal, $CNT_R(n)$ denotes reference integer phase information outputted at (n)th rising edge, $CNT_R(n-1)$ denotes reference integer phase information outputted at (n-1)th rising edge, $fr_R(n)$ denotes reference fraction phase information outputted at (n)th rising edge, and $fr_R(n-1)$ denotes reference fraction phase information outputted at (n-1)th rising edge.

The second conversion unit may generate oscillation fraction phase information based upon the oscillation delay information, and generates oscillation phase information by adding the oscillation fraction phase information to the oscillation integer phase information.

The second conversion unit may include a second edge detection block configured to generate an oscillation position signal based upon the oscillation delay information, a second encoder block configured to generate the oscillation fraction phase information based upon the oscillation position signal, a second adder block configured to generate the oscillation phase information by adding the oscillation fraction phase information to the oscillation integer phase information, and a second differentiation block configured to perform a differentiation operation on the oscillation phase information to generate the oscillation frequency information.

The second conversion unit may convert the frequency of the oscillation signal into the oscillation frequency information using:

$$dF_{VCO}(n) = \frac{F_{OSC}}{F_{VCO}} = CNT_V(n) - CNT_V(n-1) - 1 + fr_V(n) + 1 - fr_V(n-1)$$

where $dF_{VCO}(n)$ denotes oscillation frequency information detected at (n)th rising edge, $F_{OSC}$ denotes a frequency of a clock signal, $F_{VCO}$ denotes a frequency of an oscillation signal, $CNT_V(n)$ denotes oscillation integer phase information outputted at (n)th rising edge, $CNT_V(n-1)$ denotes oscillation integer phase information outputted at (n-1)th rising edge, $fr_V(n)$ denotes oscillation fraction phase information outputted at (n)th rising edge, $fr_V(n-1)$ denotes oscillation fraction phase information outputted at (n-1)th rising edge.

The calculation unit may include a first integration block configured to convert the reference frequency information into the first phase information by performing an integration operation on the reference frequency information, a second integration block configured to convert the oscillation frequency information into the second phase information by performing an integration operation on the oscillation frequency information, and a calculation block configured to calculate the digital phase difference between the first phase information and the second phase information.

The first integration block converts the reference frequency information into the first phase information using:

$$dP_{REF} = \int dF_{REF}(n)$$

where $dP_{REF}$ denotes first phase information, and $dF_{REF}(n)$ denotes reference frequency information detected at (n)th rising edge.

The second integration block converts the oscillation frequency information into the second phase information using:

$$dP_{VCO} = \int dF_{VCO}(n)$$

where $dP_{VCO}$ denotes second phase information, and $dF_{VCO}(n)$ denotes oscillation frequency information detected at (n)th rising edge.

The calculation block may calculate the digital phase difference using:

$$dP_{err} = dP_{REF} - dP_{VCO}$$

where $dp_{err}$ denotes a digital phase difference between a first phase information and a second phase information, $dP_{REF}$ denotes first phase information, and $dP_{VCO}$ denotes second phase information.

The calculation block may calculate a plurality of digital phase differences between the first phase information and a plurality of consecutive second phase information, and selects an optimum digital phase difference among the digital phase differences.

The calculation block may include a phase difference generator configured to generate a first through n(th) digital phase difference by performing a subtraction operation between the first phase information and the consecutive second phase information, a controller configured to output an optimum digital phase difference selection signal for selecting the optimum digital phase difference among the first through n(th) digital phase difference, and a multiplexer configured to output the optimum digital phase difference based upon the optimum phase difference selection signal.

According to an exemplary embodiment a digital phase locked loop includes a digital phase detector configured to generate an error signal based upon a frequency of a reference signal and a frequency of an oscillation signal, a digital loop filter configured to generate a control signal for controlling the frequency of the oscillation signal based upon the error signal, and an oscillator configured to generate the oscillation signal based upon the control signal. The digital phase detector includes a quantization unit configured to quantize the frequency of the reference signal to generate reference delay information and reference integer phase information, and configured to quantize the frequency of the oscillation signal to generate oscillation delay information and oscillation integer phase information, a first conversion unit configured to convert the frequency of the reference signal into reference frequency information based upon the reference delay information and the reference integer phase information, a second conversion unit configured to convert the frequency of the oscillation signal into oscillation frequency information based upon the oscillation delay information and the oscillation integer phase information, and a calculation unit configured to convert the reference frequency information into first phase information, configured to convert the oscillation frequency information into second phase information, and configured to output a digital phase difference between the first phase information and the second phase information, the digital phase difference corresponding to the error signal.

The digital phase locked loop may further include a divider configured to divide the frequency of the oscillation signal that is outputted from the oscillator to the digital phase detector by a predetermined value.

The quantization unit may include a ring oscillator configured to generate a reference passing signal, an oscillation passing signal, and a clock signal based upon the reference signal and the oscillation signal, a first latch block configured to generate the reference delay information based upon the reference signal and the reference passing signal, a second latch block configured to generate the oscillation delay information based upon the oscillation signal and the oscillation passing signal, and a counter block configured to count the clock signal to generate the reference integer phase information and the oscillation integer phase information.

The first conversion unit may include a first edge detection block configured to generate a reference position signal based upon the reference delay information, a first encoder block configured to generate the reference fraction phase information based upon the reference position signal, a first adder block configured to generate the reference phase information by adding the reference fraction phase information to the reference integer phase information, and a first differentiation block configured to perform a differentiation operation on the reference phase information to generate the reference frequency information.

The second conversion unit may include a second edge detection block configured to generate an oscillation position signal based upon the oscillation delay information, a second encoder block configured to generate the oscillation fraction phase information based upon the oscillation position signal, a second adder block configured to generate the oscillation phase information by adding the oscillation fraction phase information to the oscillation integer phase information, and a second differentiation block configured to perform a differentiation operation on the oscillation phase information to generate the oscillation frequency information.

The calculation unit may include a first integration block configured to convert the reference frequency information into the first phase information by performing an integration operation on the reference frequency information, a second integration block configured to convert the oscillation frequency information into the second phase information by performing an integration operation on the oscillation frequency information, and a calculation block configured to calculate the digital phase difference between the first phase information and the second phase information.

BRIEF DESCRIPTION OF THE DRAWINGS

Illustrative, non-limiting exemplary embodiments will be more clearly understood from the following detailed description taken in conjunction with the accompanying drawings. Like numerals refer to like elements throughout.

FIGS. 2A and 2B are block diagrams illustrating a quantization unit in a digital phase detector of FIG. 1.

DETAILED DESCRIPTION OF THE EMBODIMENTS

Various exemplary embodiments will be described more fully hereinafter with reference to the accompanying drawings. Like numerals refer to like elements throughout.

It will be understood that, although the terms first, second, third etc. may be used herein to describe various elements, these elements should not be limited by these terms. These terms are used to distinguish one element from another. Thus, a first element discussed below could be termed a second element without departing from the teachings of the present invention.

It will be understood that when an element is referred to as being "connected" or "coupled" to another element, it can be directly connected or coupled to the other element or intervening elements may be present.

Figure 1:
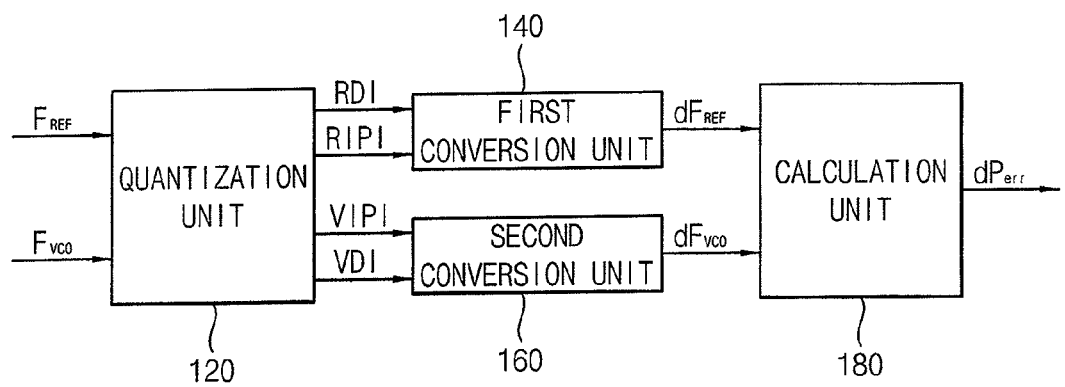
FIG. 1 is a block diagram illustrating a digital phase detector according to an exemplary embodiment.

FIG. 1 is a block diagram illustrating a digital phase detector according to an exemplary embodiment. The digital phase detector 100 may include a quantization unit 120, a first conversion unit 140, a second conversion unit 160, and a calculation unit 180.

The quantization unit 120 quantizes a frequency $F_{REF}$ of a reference signal and a frequency $F_{VCO}$ of an oscillation signal. The reference signal may be generated by a crystal oscillator that uses a crystal material. Thus, the frequency $F_{REF}$ of the reference signal may be used as a reference frequency for the frequency $F_{VCO}$ of the oscillation signal. The oscillation signal inputted into the digital phase detector 100 may be generated by a voltage controlled oscillator in a digital phase locked loop. In an exemplary embodiment, the frequency $F_{VCO}$ of the oscillation signal may be divided by a divider in the digital phase locked loop before the oscillation signal is inputted into the digital phase detector 100. In an exemplary embodiment, the frequency $F_{VCO}$ of the oscillation signal may not be divided by the divider in the digital phase locked loop before the oscillation signal is inputted into the digital phase detector 100. The quantization unit 120 may include a ring oscillator, a first latch block, a second latch block, and a counter block. Operations of the ring oscillator, the first latch block, the second latch block, and the counter block will be described in detail referring to FIGS. 2A and 2B.

The first conversion unit 140 converts the frequency $F_{REF}$ of the reference signal into reference frequency information $dF_{REF}$ based upon reference phase information RPI. The reference phase information RPI may be generated by adding reference fraction phase information RFPI to reference integer phase information RIPI. The reference fraction phase information RFPI may be generated by encoding reference delay information RDI to binary information. The reference integer phase information RIPI may be outputted from the counter block of the quantization unit 120. When the reference phase information RPI is generated, the first conversion unit 140 converts the frequency $F_{REF}$ of the reference signal into the reference frequency information $dF_{REF}$ by performing a differentiation operation on the reference phase information RPI. The first conversion unit 140 may include a first edge detection block, a first encoder block, a first adder block, and a first differentiation block. Operations of the first edge detection block, the first encoder block, the first adder block, and the first differentiation block will be described in detail referring to FIG. 3.

The second conversion unit 160 converts the frequency $F_{VCO}$ of the oscillation signal into oscillation frequency information $dF_{VCO}$ based upon oscillation phase information VPI. The oscillation phase information VPI may be generated by adding oscillation fraction phase information VFPI to oscillation integer phase information VIPI. The oscillation fraction phase information VFPI may be generated by encoding an oscillation delay information VDI to binary information. The oscillation integer phase information VIPI may be outputted from the counter block of the quantization unit 120. When the oscillation phase information VPI is generated, the second conversion unit 160 converts the frequency $F_{VCO}$ of the oscillation signal into the oscillation frequency information $dF_{VCO}$ by performing a differentiation operation on the oscillation phase information VPI. The second conversion unit 160 may include a second edge detection block, a second encoder block, a second adder block, and a second differentiation block. Operations of the second edge detection block, the second encoder block, the second adder block, and the second differentiation block will be described in detail referring to FIG. 4.

The calculation unit 180 converts the reference frequency information $dF_{REF}$ into first phase information $dP_{REF}$, converts the oscillation frequency information $dF_{VCO}$ into second phase information $dP_{VCO}$, and outputs a digital phase difference $dP_{err}$ between the first phase information $dP_{REF}$ and the second phase information $dP_{VCO}$. That is, the digital phase detector 100 performs a subtraction operation between the first phase information $dP_{REF}$ and the second phase information $dP_{VCO}$. For this reason, the digital phase detector 100 may be implemented by a simple structure. Thus, the digital phase detector 100 may provide small size implementation and low power consumption as compared to a conventional digital phase detector that generates a digital phase difference by dividing the oscillation frequency information by the reference frequency information. For example, to achieve high bit resolution, the conventional digital phase detector needs to increase the number of input-bits and output-bits, and to include a large size divider as well as additional elements. On the other hand, the digital phase detector 100 may achieve the high bit resolution without the large size divider as well as the additional elements because the digital phase detector 100 generates the digital phase difference $dp_{err}$ by performing the subtraction operation between the first phase information $dP_{REF}$ and the second phase information $dP_{VCO}$.

The calculation unit 180 may include a first integration block, a second integration block, and a calculation block to generate the digital phase difference $dP_{err}$ between the first phase information $dP_{REF}$ and the second phase information $dP_{VCO}$. Here, the digital phase difference $dP_{err}$ between the first phase information $dP_{REF}$ and the second phase information $dP_{VCO}$ corresponds to a digital value of a phase difference between the reference signal and the oscillation signal. Operations of the first integration block, the second integration block, and the calculation block will be described in detail referring to FIG. 5. In an exemplary embodiment, the calculation unit 180 may include a single-structure that outputs the digital phase difference $dP_{err}$ between the first phase information $dP_{REF}$ and the second phase information $dP_{VCO}$. In an exemplary embodiment, the calculation unit 180 may include a multiple-part structure that outputs an optimum digital phase difference $dP_{err}$ that is selected among a plurality of digital phase differences $dP_{err\_1}$ through $dP_{err\_n}$ between the first phase information $dP_{REF}$ and a plurality of consecutive second phase information $dP_{VCO\_1}$ through $dP_{VCO\_n}$. An output jumping phenomenon due to phase sampling position errors may be eliminated when the calculation unit 180 includes the multiple-part structure. Operations of the multiple-part structure will be described in detail referring to FIGS. 6A and 6B.

Figure 2A:
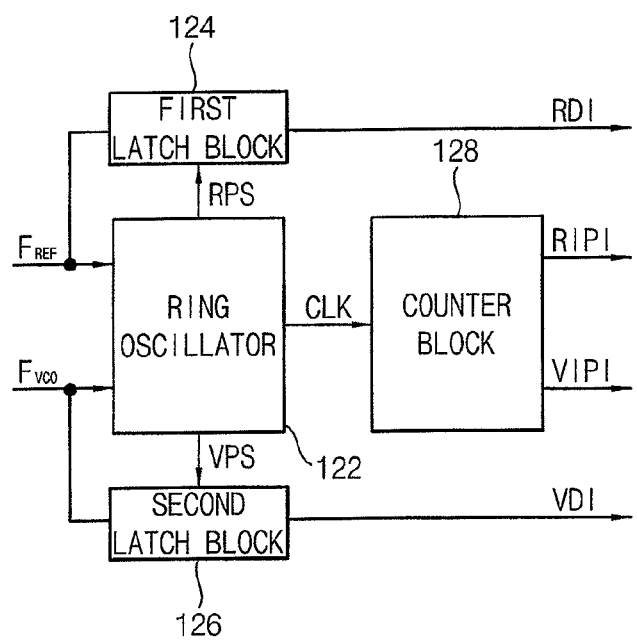
Figure 2B:
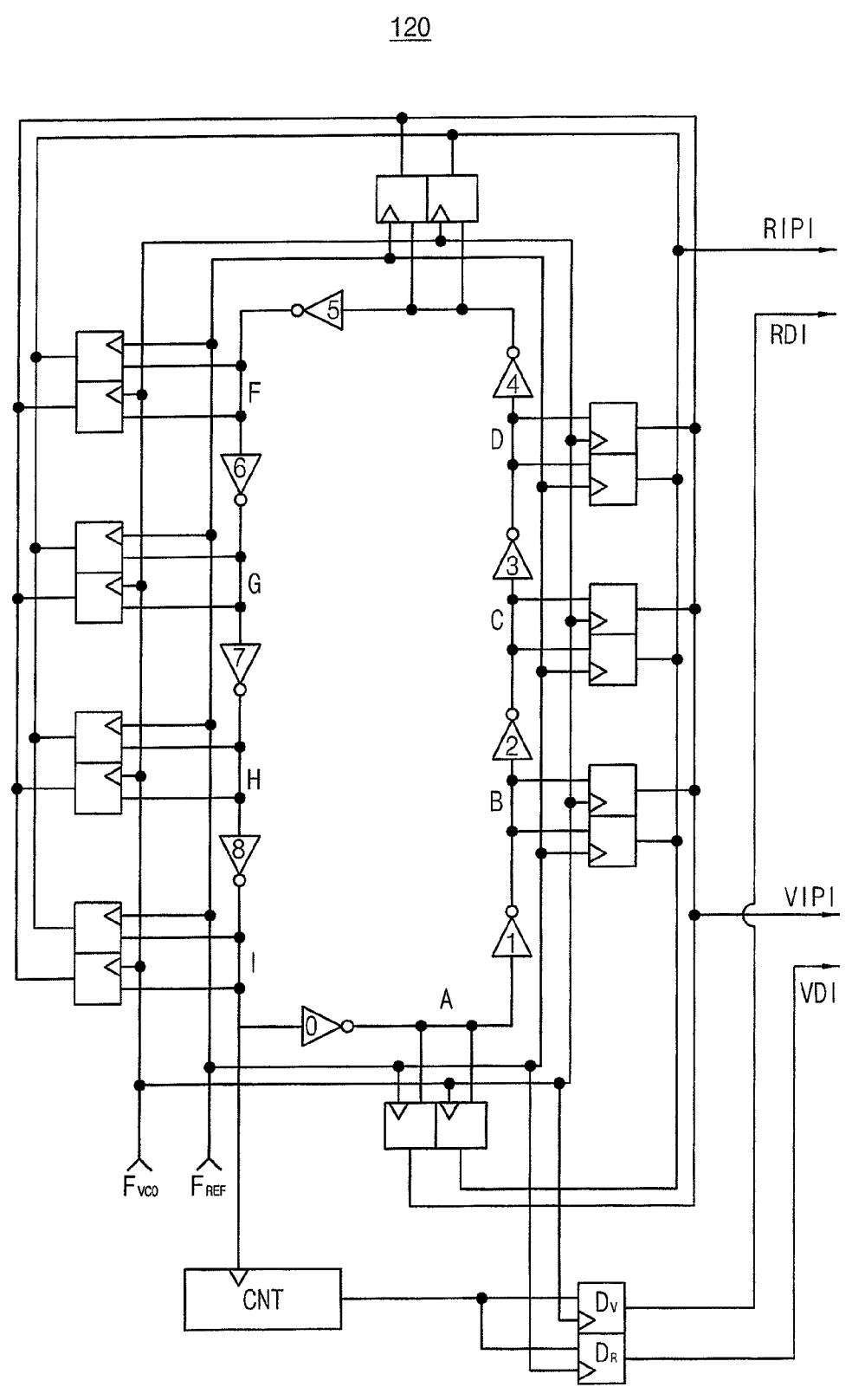

FIGS. 2A and 2B are block diagrams illustrating a quantization unit in a digital phase detector of FIG. 1. The quantization unit 120 may include a ring oscillator 122, a first latch block 124, a second latch block 126, and a counter block 128.

The ring oscillator 122 includes a plurality of delay elements 0, . . . 8 that form a feedback loop having a ring-structure. The ring oscillator 122 receives the reference signal having the frequency $F_{REF}$ and the oscillation signal having the frequency $F_{VCO}$, and generates a clock signal CLK having a frequency $F_{OSC}$. The clock signal CLK is outputted into the counter block 128, so that the clock signal CLK may be counted during one period of the oscillation signal having the frequency $F_{VCO}$. Because the structure of the ring oscillator 122 in FIG. 2B is an exemplary embodiment, the structure of the ring oscillator 122 is not limited thereto.

The first latch block 124 includes a plurality of first latches. The number of the first latches in the first latch block 124 is same as the number of the delay elements 0, . . . 8 in the ring oscillator 122. The first latch block 124 receives the reference signal having the frequency $F_{REF}$, and outputs the reference delay information RDI based upon a reference passing signal RPS. The reference passing signal RPS indicates states of signals that pass through each of the delay elements 0, . . . 8. The states of signals that pass through each of the delay elements 0, . . . 8 are detected at a rising edge of the reference signal having the frequency $F_{REF}$. In addition, the second latch block 126 includes a plurality of second latches. The number of the second latches in the second latch block 126 is same as the number of the delay elements 0, . . . 8 in the ring oscillator 122. The second latch block 126 receives the oscillation signal having the frequency $F_{VCO}$, and outputs the oscillation delay information VDI based upon an oscillation passing signal VPS. The oscillation passing signal VPS indicates states of signals that pass through each of the delay elements 0, . . . 8. The states of signals that pass through each of the delay elements 0, . . . 8 are detected at a rising edge of the oscillation signal having the frequency $F_{VCO}$.

The counter block 128 receives the clock signal CLK from the ring oscillator 122, counts the clock signal CLK during one period of the reference signal having the frequency $F_{REF}$, and outputs the reference integer phase information RIPI. In addition, the counter block 128 receives the clock signal CLK from the ring oscillator 122, counts the clock signal CLK during one period of the oscillation signal having the frequency $F_{VCO}$, and outputs the oscillation integer phase information VIPI. As described above, the quantization unit 120 includes the ring oscillator 122, the first latch block 124, the second latch block 126, and the counter block 128. As a result, the quantization unit 120 may quantize the frequency $F_{REF}$ of the reference signal and the frequency $F_{VCO}$ of the oscillation signal to generate the reference delay information RDI, the reference integer phase information RIPI, the oscillation delay information VDI, and the oscillation integer phase information VIPI. As a result, the quantization unit 120 may output the reference delay information RDI and the reference integer phase information RIPI to the first conversion unit 140, and may output the oscillation delay information VDI and the oscillation integer phase information VIPI to the second conversion unit 160.

Figure 3:
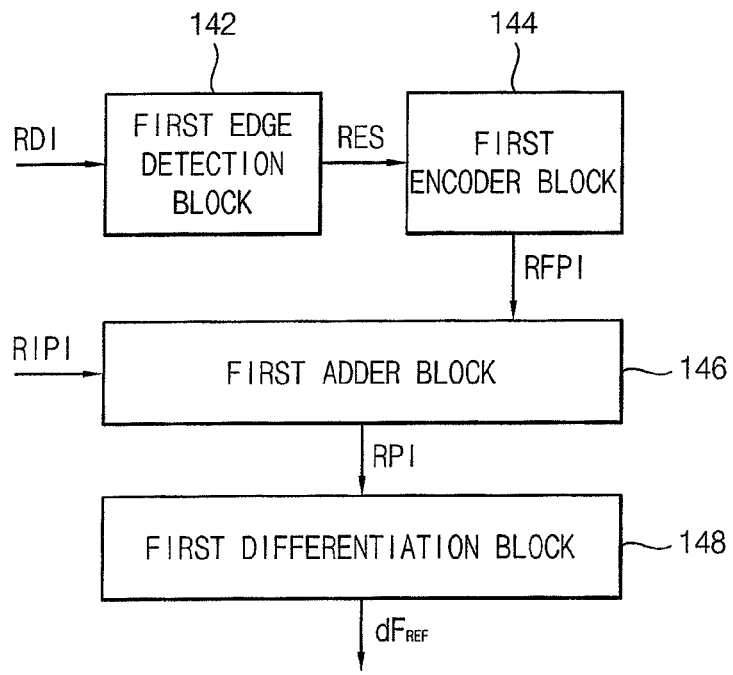
FIG. 3 is a block diagram illustrating a first conversion unit in a digital phase detector of FIG. 1.

FIG. 3 is a block diagram illustrating a first conversion unit in a digital phase detector of FIG. 1. The first conversion unit 140 may include a first edge detection block 142, a first encoder block 144, a first adder block 146, and a first differentiation block 148.

The first edge detection block 142 receives the reference delay information RDI from the first latch block 124 of the quantization unit 120, detects at least one value-changed delay element among the delay elements 0, . . . 8 based upon the reference delay information RDI, and outputs a reference position signal RES corresponding to the value-changed delay element to the first encoder block 144. The value-changed delay element may be detected based upon whether a digital value is changed from 1 to 0. The first encoder block 144 encodes the reference position signal RES to binary information to generate the reference fraction phase information RFPI, and outputs the reference fraction phase information RFPI to the first adder block 146. The first adder block 146 receives the reference fraction phase information RFPI from the first encoder block 144, receives the reference integer phase information RIPI from the counter block 128 of the quantization unit 120, generates the reference phase information RPI by adding the reference fraction phase information RFPI to the reference integer phase information RIPI, and outputs the reference phase information RPI to the first differentiation block 148. The first differentiation block 148 receives the reference phase information from the first adder block 146, and performs a differentiation operation on the reference phase information RPI to convert the frequency $F_{REF}$ of the reference signal into the reference frequency information $dF_{REF}$. In an exemplary embodiment, the first differentiation block 148 may receive a reference re-timing clock signal generated by re-aligning the reference signal based upon the clock signal CLK.

As described above, the first conversion unit 140 includes the first edge detection block 142, the first encoder block 144, the first adder block 146, and the first differentiation block 148. In particular, the first conversion unit 140 may convert the frequency $F_{REF}$ of the reference signal into the reference frequency information $dF_{REF}$ using [Expression 1]:

$$dF_{REF}(n) = \frac{F_{OSC}}{F_{REF}} = \quad \text{[Expression 1]}$$
$$CNT_R(n) - CNT_R(n-1) - 1 + fr_R(n) + 1 - fr_R(n-1)$$

Here, $dF_{REF}(n)$ denotes reference frequency information detected at (n)th rising edge. $F_{OSC}$ denotes a frequency of a clock signal. $F_{REF}$ denotes a frequency of a reference signal. $CNT_R(n)$ denotes reference integer phase information outputted at (n)th rising edge. $CNT_R(n-1)$ denotes reference integer phase information outputted at (n-1)th rising edge. $fr_R(n)$ denotes reference fraction phase information outputted at (n)th rising edge. $fr_R(n-1)$ denotes reference fraction phase information outputted at (n-1)th rising edge.

Figure 4:
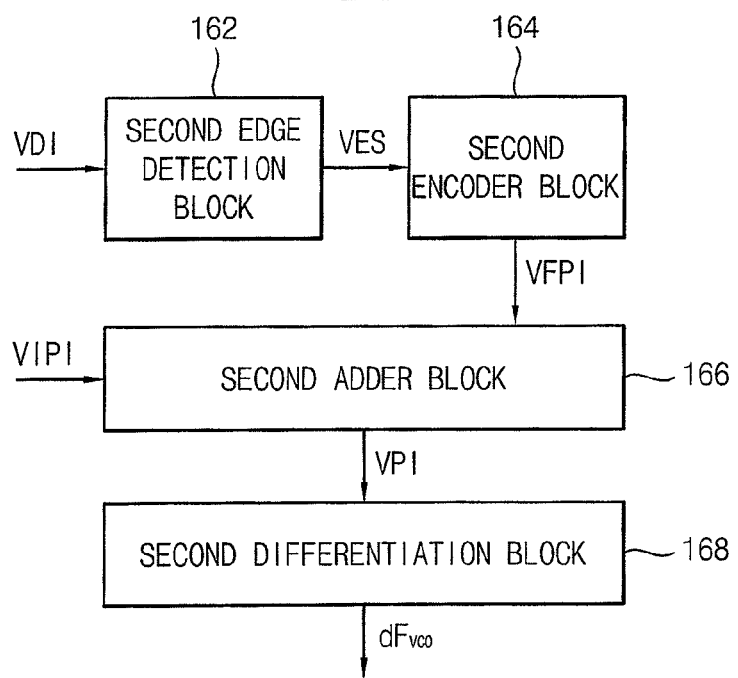
FIG. 4 is a block diagram illustrating a second conversion unit in a digital phase detector of FIG. 1.

FIG. 4 is a block diagram illustrating a second conversion unit in a digital phase detector of FIG. 1. The second conversion unit 160 may include a second edge detection block 162, a second encoder block 164, a second adder block 166, and a second differentiation block 168.

The second edge detection block 162 receives the oscillation delay information VDI from the second latch block 126 of the quantization unit 120, detects at least one value-changed delay element among the delay elements 0, ... 8 based upon the oscillation delay information VDI, and outputs an oscillation position signal VES corresponding to the value-changed delay element to the second encoder block 164. The value-changed delay element may be detected based upon whether a digital value is changed from 1 to 0. The second encoder block 164 encodes the oscillation position signal VES to binary information to generate the oscillation fraction phase information VFPI, and outputs the oscillation fraction phase information VFPI to the second adder block 166. The second adder block 166 receives the oscillation fraction phase information VFPI from the second encoder block 164, receives the oscillation integer phase information VIPI from the counter block 128 of the quantization unit 120, generates the oscillation phase information VPI by adding the oscillation fraction phase information VFPI to the oscillation integer phase information VIPI, and outputs the oscillation phase information VPI to the second differentiation block 168. The second differentiation block 168 receives the oscillation phase information VPI from the second adder block 166, and performs a differentiation operation on the oscillation phase information VPI to convert the frequency $F_{VCO}$ of the oscillation signal into the oscillation frequency information $dF_{VCO}$. In an exemplary embodiment, the second differentiation block 168 may receive a reference re-timing clock signal generated by re-aligning the reference signal based upon the clock signal CLK.

As described above, the second conversion unit 160 includes the second edge detection block 162, the second encoder block 164, the second adder block 166, and the second differentiation block 168. In particular, the second conversion unit 160 may convert the frequency $F_{VCO}$ of the oscillation signal into the oscillation frequency information $dF_{VCO}$ using [Expression 2]:

$$dF_{VCO}(n) = \frac{F_{OSC}}{F_{VCO}} = \quad \text{[Expression 2]}$$
$$CNT_V(n) - CNT_V(n-1) - 1 + fr_V(n) + 1 - fr_V(n-1)$$

Here, $dF_{VCO}(n)$ denotes oscillation frequency information detected at (n)th rising edge. $F_{OSC}$ denotes a frequency of a clock signal. $F_{VCO}$ denotes a frequency of an oscillation signal. $CNT_V(n)$ denotes oscillation integer phase information outputted at (n)th rising edge. $CNT_V(n-1)$ denotes oscillation integer phase information outputted at (n-1)th rising edge. $fr_V(n)$ denotes oscillation fraction phase information outputted at (n)th rising edge. $fr_V(n-1)$ denotes oscillation fraction phase information outputted at (n-1)th rising edge.

Figure 5:
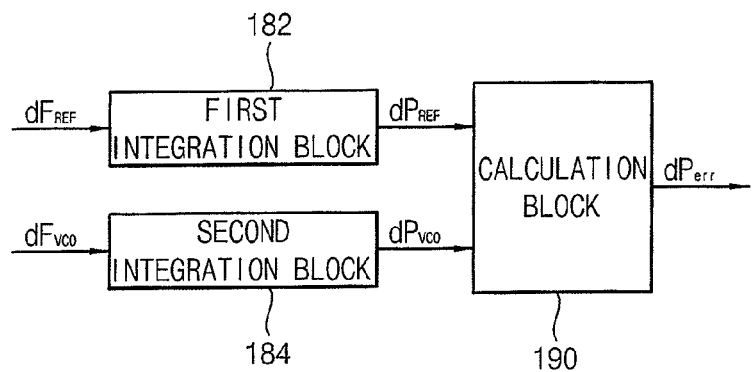
FIG. 5 is a block diagram illustrating a calculation unit in a digital phase detector of FIG. 1.

FIG. 5 is a block diagram illustrating a calculation unit in a digital phase detector of FIG. 1. The calculation unit 180 may include a first integration block 182, a second integration block 184, and a calculation block 190.

The first integration block 182 converts the reference frequency information $dF_{REF}$ into the first phase information $dP_{REF}$ by performing an integration operation on the reference frequency information $dF_{REF}$. The second integration block 184 converts the oscillation frequency information $dF_{VCO}$ into the second phase information $dP_{VCO}$ by performing an integration operation on the oscillation frequency information $dF_{VCO}$. The calculation block 190 generates the digital phase difference $dP_{err}$ by performing a subtraction operation between the first phase information $dP_{REF}$ and the second phase information $dP_{VCO}$. As described above, the digital phase detector 100 may be implemented in small size, may consume low power, and may detect the phase difference between the reference signal and the oscillation signal accurately because the digital phase detector 100 uses the calculation unit 180 that generates the digital phase difference $dP_{err}$ by performing a subtraction operation between the first phase information $dP_{REF}$ and the second phase information $dP_{VCO}$. Hereinafter, operations of the first integration block 182, the second integration block 184, and the calculation block 190 will be described based upon [Expression 3] through [Expression 10].

The first integration block 182 may convert the reference frequency information $dF_{REF}$ into the first phase information $dP_{REF}$ using [Expression 3]:

$$dP_{REF} = \int dF_{REF}(n) \quad \text{[Expression 3]}$$

Here, $dP_{REF}$ denotes first phase information. $dF_{REF}(n)$ denotes reference frequency information detected at (n)th rising edge.

The second integrathion block 184 may convert the oscillation frequency information $dF_{VCO}$ into the second phase information $dP_{VCO}$ using [Expression 4]:

$$dP_{VCO} = \int dF_{VCO}(n) \quad \text{[Expression 4]}$$

Here, $dP_{VCO}$ denotes second phase information. $dF_{VCO}(n)$ denotes oscillation frequency information detected at (n)th rising edge.

The calculation block may calculate the digital phase difference $dP_{err}$ between the first phase information $dP_{REF}$ and the second phase information $dP_{VCO}$ using [Expression 5]:

$$dP_{err} = dP_{REF} - dP_{VCO} \quad \text{[Expression 5]}$$

Here, $dP_{err}$ denotes a digital phase difference between first phase information and second phase information. $dP_{REF}$ denotes first phase information. $dP_{VCO}$ denotes second phase information.

[Expression 5] may be transformed into [Expression 6] when [Expression 3] and [Expression 4] are applied into [Expression 5]:

$$dP_{err} = dP_{REF} - dP_{VCO} = \int \frac{F_{OSC}}{F_{REF}} - \int \frac{F_{OSC}}{F_{VCO}} \quad \text{[Expression 6]}$$

Here, the frequency $F_{OSC}$ of the clock signal CLK has a constant value. In addition, the frequency $F_{REF}$ of the reference signal has a constant value. Thus, the frequency $F_{OSC}$ of the clock signal CLK and the frequency $F_{REF}$ of the reference signal may be handled as a constant when an integration operation is performed. Therefore, [Expression 6] may be transformed into [Expression 7]:

$$dP_{err} = \frac{F_{OSC}}{F_{REF}} \cdot \int \left(1 - \frac{F_{REF}}{F_{VCO}}\right) \qquad \text{[Expression 7]}$$

When the frequency $F_{VCO}$ of the oscillation signal is substantially same as the frequency $F_{REF}$ of the reference signal (i.e., when the phase is substantially locked), [Expression 7] may be transformed into [Expression 8]:

$$dP_{err} = \frac{F_{OSC} \cdot F_{VCO}}{F_{REF}} \cdot \int (F_{VCO} - F_{REF}) \cong \qquad \text{[Expression 8]}$$

$$F_{OSC} \cdot \left(\int F_{VCO} - \int F_{REF}\right)$$

As described above, [Expression 8] is a math-form in which the frequency $F_{OSC}$ of the clock signal CLK is used as a gain. The digital phase difference $dP_{err}$ between the first phase information $dP_{REF}$ and the second phase information $dP_{VCO}$ may be calculated using [Expression 8]. Thus, the phase difference between the reference signal and the oscillation signal may be detected accurately.

Further, the calculation unit 180 may generate the digital phase difference $dP_{err}$ between the first phase information $dP_{REF}$ and the second phase information $dP_{VCO}$ accurately even when the frequency $F_{OSC}$ of the clock signal CLK is slightly changed. For example, if it is assumed that the frequency $F_{OSC}$ of the clock signal CLK is changed by a variation $\Delta F_{OSC}$, [Expression 6] may be transformed into [Expression 9]:

$$dP_{err} = \qquad \text{[Expression 9]}$$
$$dP_{REF} - dP_{VCO} = \int \frac{F_{OSC} + \Delta F_{OSC}}{F_{REF}} - \int \frac{F_{OSC} + \Delta F_{OSC}}{F_{VCO}}$$

Here, the frequency $F_{OSC}$ of the clock signal CLK has a fixed value. In addition, the frequency $F_{REF}$ of the reference signal has a fixed value. Thus, the frequency $F_{OSC}$ of the clock signal CLK and the frequency $F_{REF}$ of the reference signal may be handled as a constant. Therefore, [Expression 9] may be transformed into [Expression 10]:

$$dP_{err} = \frac{F_{OSC}}{F_{REF}} \cdot \int \left(1 - \frac{F_{REF}}{F_{VCO}}\right) + \int \frac{(F_{REF} - F_{VCO})}{F_{REF} \cdot F_{VCO}} \cdot \Delta F_{OSC} \qquad \text{[Expression 10]}$$

When the frequency $F_{VCO}$ of the oscillation signal and the frequency $F_{REF}$ of the reference signal have a similar value (i.e., when the phase is substantially locked), a frequency difference between the frequency $F_{VCO}$ of the oscillation signal and the frequency $F_{REF}$ of the reference signal almost becomes zero (i.e., $F_{REF} - F_{VCO} \cong 0$), and a multiplication value between the frequency $F_{VCO}$ of the oscillation signal and the frequency $F_{REF}$ of the reference signal almost becomes a square of the frequency $F_{REF}$ of the reference signal (i.e., $F_{REF} \cdot F_{VCO} \cong F^2_{REF}$). As a result, [Expression 10] may be substantially the same as [Expression 8] because the frequency variation $\Delta F_{OSC}$ is ignorable. That is, the digital phase difference $dP_{err}$ between the first phase information $dP_{REF}$ and the second phase information $dP_{VCO}$ may be accurately generated even when the frequency $F_{OSC}$ of the clock signal CLK is slightly changed.

As described above, in an exemplary embodiment, the calculation block 190 may have a single-structure in which the digital phase difference $dP_{err}$ is generated by performing a subtraction operation between one first phase information $dP_{REF}$ and one second phase information $dP_{VCO}$. In an exemplary embodiment, the calculation block 190 may have a multiple-part structure in which an optimum digital phase difference $dP_{err}$ may be selected among a plurality of digital phase differences $dP_{err\_1}, \ldots dP_{err\_n}$ between one first phase information $dP_{REF}$ and a plurality of consecutive second phase information $dP_{VCO\_1}, \ldots dP_{VCO\_n}$. In this case, an output jumping phenomenon due to phase sampling position errors may be eliminated. The multiple-part structure of the calculation block 190 will be described in detail referring to FIGS. 6A and 6B.

Figure 6A:
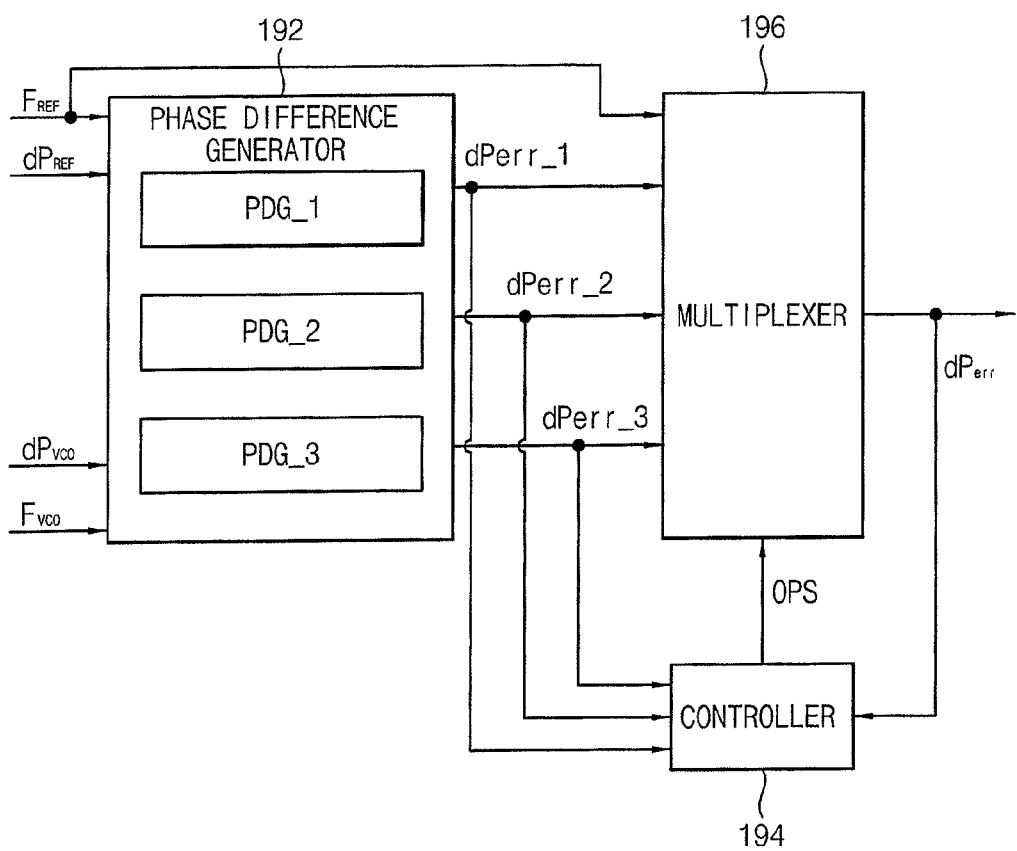
FIGS. 6A and 6B are block diagrams illustrating a calculation block in a calculation unit of FIG. 5.
Figure 6B:
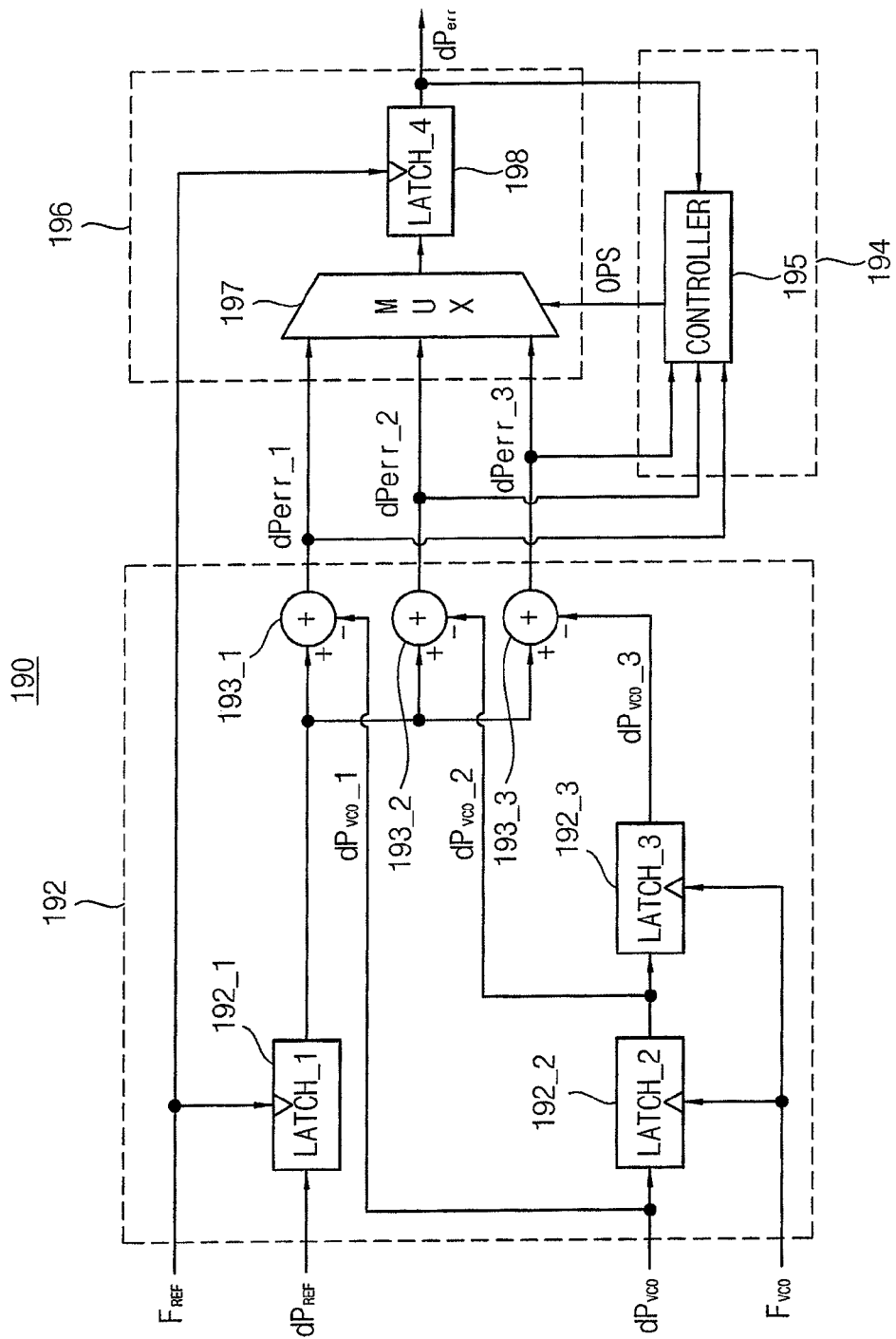

FIGS. 6A and 6B are block diagrams illustrating a calculation block in a calculation unit of FIG. 5. The calculation block 190 may include a phase difference generator 192, a controller 194, and a multiplexer 196.

To generate a first through third digital phase difference $dP_{err\_1}, dP_{err\_2}, dP_{err\_3}$, the phase difference generator 192 may include a first phase difference generator PDG_1, second phase difference generator PDG_2, and third phase difference generator PDG_3. The first phase difference generator PDG_1 may include a first latch 192_1 and a first adder 193_1. The second phase difference generator PDG_2 may include a second latch 192_2 and a second adder 193_2. The third phase difference generator PDG_3 may include a third latch 192_3 and a third adder 193_3. The phase difference generator 192 generates the first through third digital phase differences $dP_{err\_1}, dP_{err\_2}, dP_{err\_3}$ by performing subtraction operations between the first phase information $dP_{REF}$ and the consecutive second phase information $dP_{VCO\_1}, dP_{VCO\_2}, dP_{VCO\_3}$. The consecutive second phase information $dP_{VCO\_1}$ may correspond to second phase information $dP_{VCO}$. The consecutive second phase information $dP_{VCO\_2}$ may be the second phase information $dP_{VCO}$ latched by the second latch 192_2. The consecutive second phase information $dP_{VCO\_3}$ may be the second phase information $dP_{VCO}$ latched by the second latch 192_2 and the third latch 192_3.

In the first phase difference generator PDG_1, the first digital phase difference $dP_{err\_1}$ is generated by performing the subtraction operation between the first phase information $dP_{REF}$ latched by the first latch 192_1 and the consecutive second digital phase difference information $dP_{VCO\_1}$. In the second phase difference generator PDG_2, the second digital phase difference $dP_{err\_2}$ is generated by performing the subtraction operation between the first phase information $dP_{REF}$ latched by the first latch 192_1 and the consecutive second digital phase difference information $dP_{VCO\_2}$ latched by the second latch 192_2. In the third phase difference generator PDG_3, the third digital phase difference $dP_{err\_3}$ is generated by performing the subtraction operation between the first phase information $dP_{REF}$ latched by the first latch 192_1 and the consecutive second digital phase difference information $dP_{VCO\_3}$ latched by the second latch 192_2 and the third latch 192_3. The first latch 192_1 may operate based upon the reference signal having the frequency $F_{REF}$. The second latch 192_2 may operate based upon the oscillation signal having the frequency $F_{VCO}$. The third latch 192_3 may operate based upon the oscillation signal having the frequency $F_{VCO}$. Thus, the phase difference generator 192 generates three digital phase differences $dP_{err\_1}$, $dP_{err\_2}$, $dP_{err\_3}$ that are candidates for an optimum digital phase difference $dP_{err}$. Although there are three digital phase differences $dP_{err\_1}$, $dP_{err\_2}$, $dP_{err\_3}$ in FIGS. 6A and 6B, the number of digital phase differences is not limited thereto.

The controller 194 may include a controller 195 that controls a multiplexer 197 in the multiplexer 196. The controller 194 receives the first through third digital phase differences $dP_{err\_1}$, $dP_{err\_2}$, $dP_{err\_3}$ from the first through third phase difference generators PDG_1, PDG_2, PDG_3, determines one as the optimum digital phase difference $dP_{err}$ among the first through third digital phase differences $dP_{err\_1}$, $dP_{err\_2}$, $dP_{err\_3}$, and outputs an optimum phase difference selection signal OPS to the multiplexer 197 in the multiplexer 196. Here, the optimum digital phase difference $dP_{err}$ may be determined as a digital phase difference that is most close to a previous outputted digital phase difference among the first through third digital phase difference $dP_{err\_1}$, $dP_{err\_2}$, and $dP_{err\_3}$. However, a method of determining the optimum digital phase difference $dP_{err}$ among the first through third digital phase differences $dP_{err\_1}$, $dP_{err\_2}$, $dP_{err\_3}$ is not limited thereto.

To output the optimum digital phase difference $dP_{err}$ among the first through third digital phase differences $dP_{err\_1}$, $dP_{err\_2}$, $dP_{err\_3}$, the multiplexer 196 may include the multiplexer 197 and a fourth latch 198. The fourth latch 198 may operate based upon the reference signal having the frequency $F_{REF}$. The multiplexer 197 receives the optimum phase difference selection signal OPS from the controller 195 of the controller 194, selects the optimum digital phase difference $dP_{err}$ among the first through third digital phase differences $dP_{err\_1}$, $dP_{err\_2}$, $dP_{err\_3}$ based upon the optimum phase difference selection signal OPS, and outputs the optimum digital phase difference $dP_{err}$ to the fourth latch 198. The fourth latch 198 latches and outputs the optimum digital phase difference $dP_{err}$.

As described above, the calculation block 190 may be implemented by the multiple-part structure in which the optimum digital phase difference $dP_{err}$ is selected among a plurality of the digital phase differences $dP_{err\_1}$, $dP_{err\_2}$, $dP_{err\_3}$. The digital phase differences $dP_{err\_1}$, $dP_{err\_2}$, $dP_{err\_3}$ are generated by performing the subtraction operations between the first phase information $dP_{REF}$ and the consecutive second phase information $dP_{VCO\_1}$, $dP_{VCO\_2}$, $dP_{VCO\_3}$. As a result, the digital phase detector 100 of FIG. 1 may eliminate the output jumping phenomenon due to phase sampling position errors. The multiple-part structure shown in FIGS. 6A and 6B is an exemplary embodiment. Thus, the multiple-part structure of the calculation block 190 is not limited thereto.

Figure 7A:
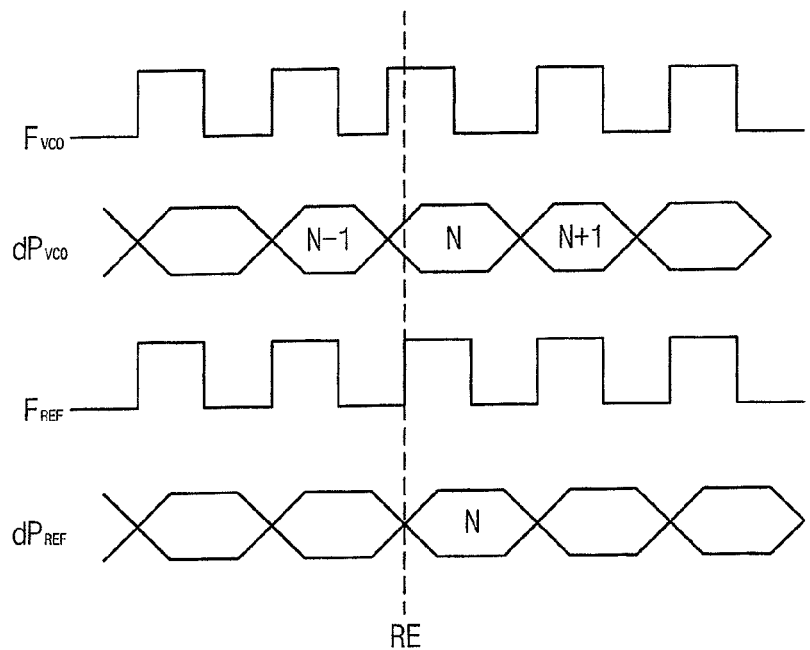
FIG. 7A is a diagram illustrating a case where a frequency of an oscillation signal is leading a frequency of a reference signal.

FIG. 7A is a diagram illustrating a case where a frequency of an oscillation signal is leading a frequency of a reference signal. An output jumping phenomenon due to phase sampling position errors may not be caused at a rising edge RE of the reference signal having the frequency $F_{REF}$ when the frequency $F_{VCO}$ of the oscillation signal is leading the frequency $F_{REF}$ of the reference signal. Thus, the digital phase difference $dP_{err}$ between the first phase information $dP_{REF}$ and the second phase information $dP_{VCO}$ may be normally calculated.

That is, the digital phase difference $dP_{err}$ between the first phase information $dP_{REF}$ and the second phase information $dP_{VCO}$ may be calculated using [Expression 11]:

$$dP_{err}(N)=dP_{REF}(N)-dP_{VCO}(N) \qquad \text{[Expression 11]}$$

Figure 7B:
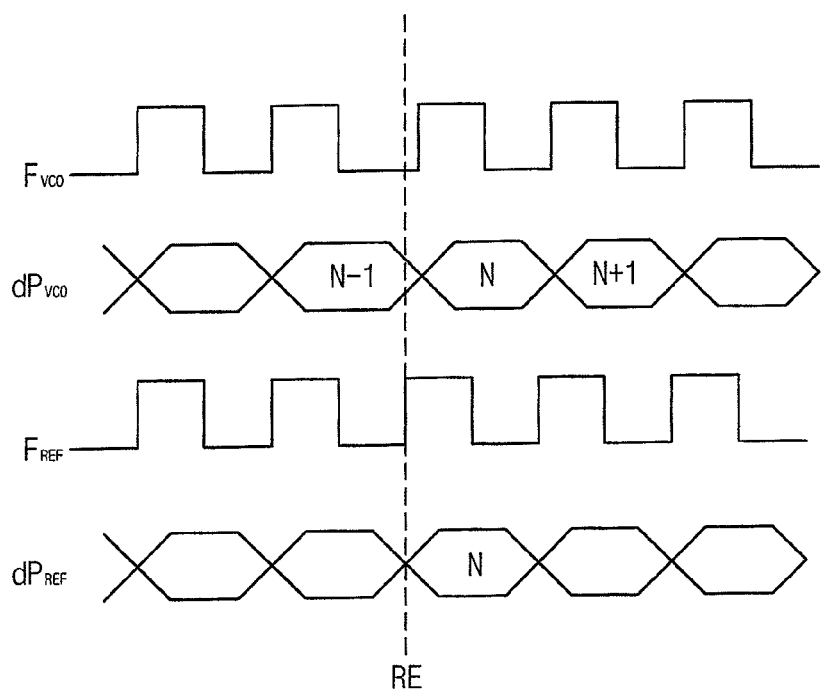
FIG. 7B is a diagram illustrating a case where a frequency of an oscillation signal is lagging a frequency of a reference signal.

FIG. 7B is a diagram illustrating a case where a frequency of an oscillation signal is lagging a frequency of a reference signal.

Referring to FIG. 7B, an output jumping phenomenon due to phase sampling position errors may be caused at a rising edge RE of the reference signal having the frequency $F_{REF}$ when the frequency $F_{VCO}$ of the oscillation signal is lagging the frequency $F_{REF}$ of the reference signal. Thus, the digital phase difference $dP_{err}$ between the first phase information $dP_{REF}$ and the second phase information $dP_{VCO}$ may be abnormally calculated.

That is, the digital phase difference $dP_{err}$ between the first phase information $dP_{REF}$ and the second phase information $dP_{VCO}$ may be calculated using [Expression 12] but [Expression 11]:

$$dP_{err}(N)=dP_{REF}(N)-dP_{VCO}(N-1) \qquad \text{[Expression 12]}$$

As a result, the output jumping phenomenon may be caused in an output of a digital phase detector when the frequency $F_{VCO}$ of the oscillation signal is lagging the frequency $F_{REF}$ of the reference signal. Thus, to eliminate the output jumping phenomenon due to phase sampling position errors, the digital phase detector may include a calculation unit having a calculation block that is implemented by a multiple-part structure described above.

Figure 8A:
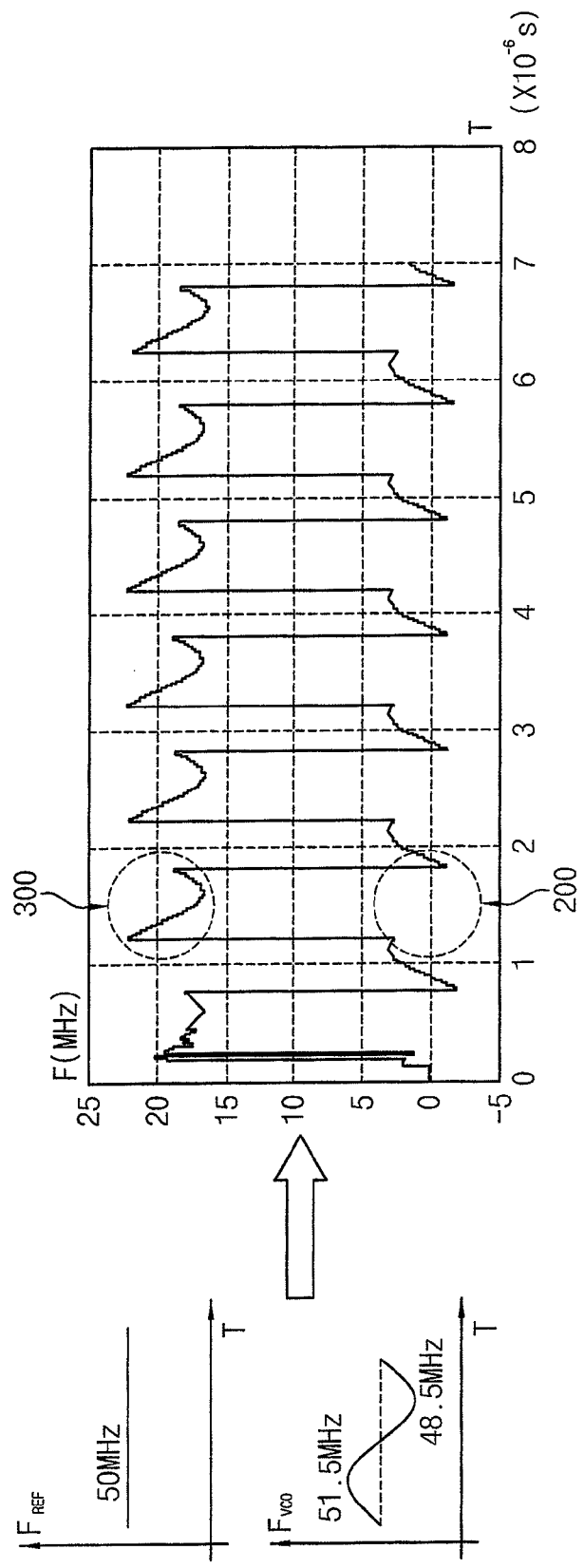
FIG. 8A is a diagram illustrating an output of a digital phase detector when a calculation unit includes a calculation block that is implemented by a single-structure.

FIG. 8A is a diagram illustrating an output of a digital phase detector when a calculation unit includes a calculation block that is implemented by a single-structure. The output jumping phenomenon due to phase sampling position errors may be caused in the output of the digital phase detector when the calculation unit includes the calculation block that is implemented by the single-structure. For example, the output jumping phenomenon may be caused in the output of the digital phase detector 100 of FIG. 1 when the calculation unit 180 of FIG. 5 does not include the calculation block 190 of FIGS. 6A and 6B. As shown in FIG. 8A, although the output of the digital phase detector is supposed to appear in a first region 200, the output of the digital phase detector appears in a second region 300. That is, the output jumping phenomenon due to phase sampling position errors is caused in a time region from $1 \times 10^{-6}$ s to $2 \times 10^{-6}$ s.

Figure 8B:
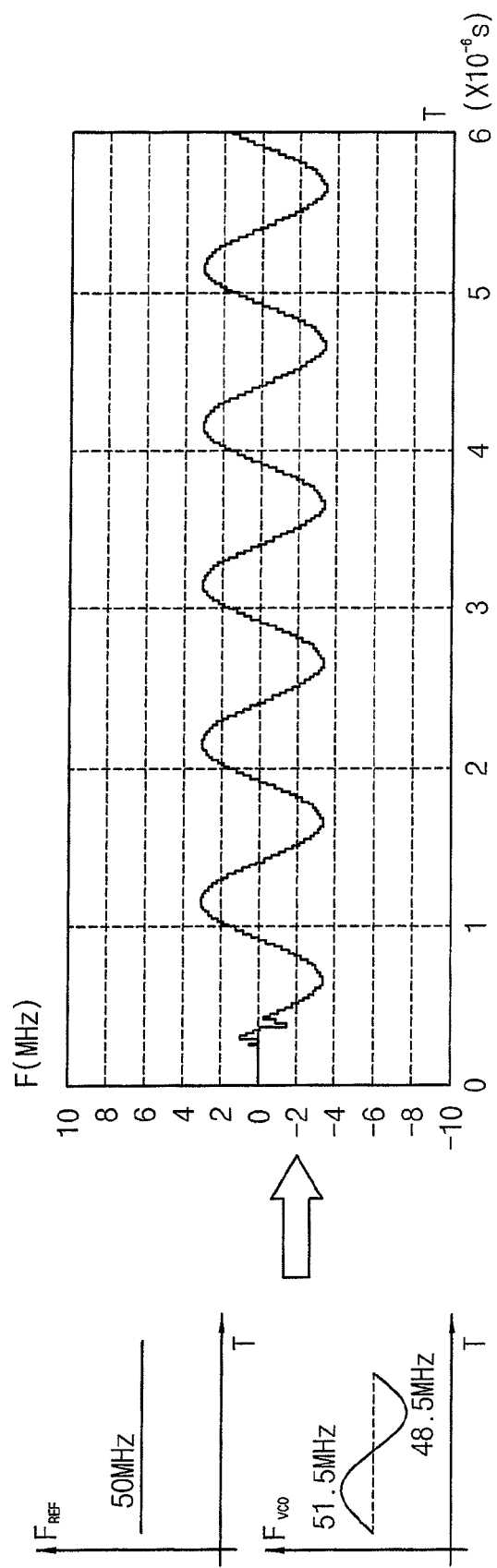
FIG. 8B is a diagram illustrating an output of a digital phase detector when a calculation unit includes a calculation block that is implemented by a multiple-part structure.

FIG. 8B is a diagram illustrating an output of a digital phase detector when a calculation unit includes a calculation block that is implemented by a multiple-part structure. The output jumping phenomenon due to phase sampling position errors may not be caused in the output of the digital phase detector when the calculation unit includes the calculation block that is implemented by the multiple-part structure. For example, the output jumping phenomenon may be eliminated in the output of the digital phase detector 100 of FIG. 1 when the calculation unit 180 of FIG. 5 includes the calculation block 190 of FIGS. 6A and 6B. As shown in FIG. 8B, the output jumping phenomenon due to phase sampling position errors is not caused in all time regions.

Figure 9:
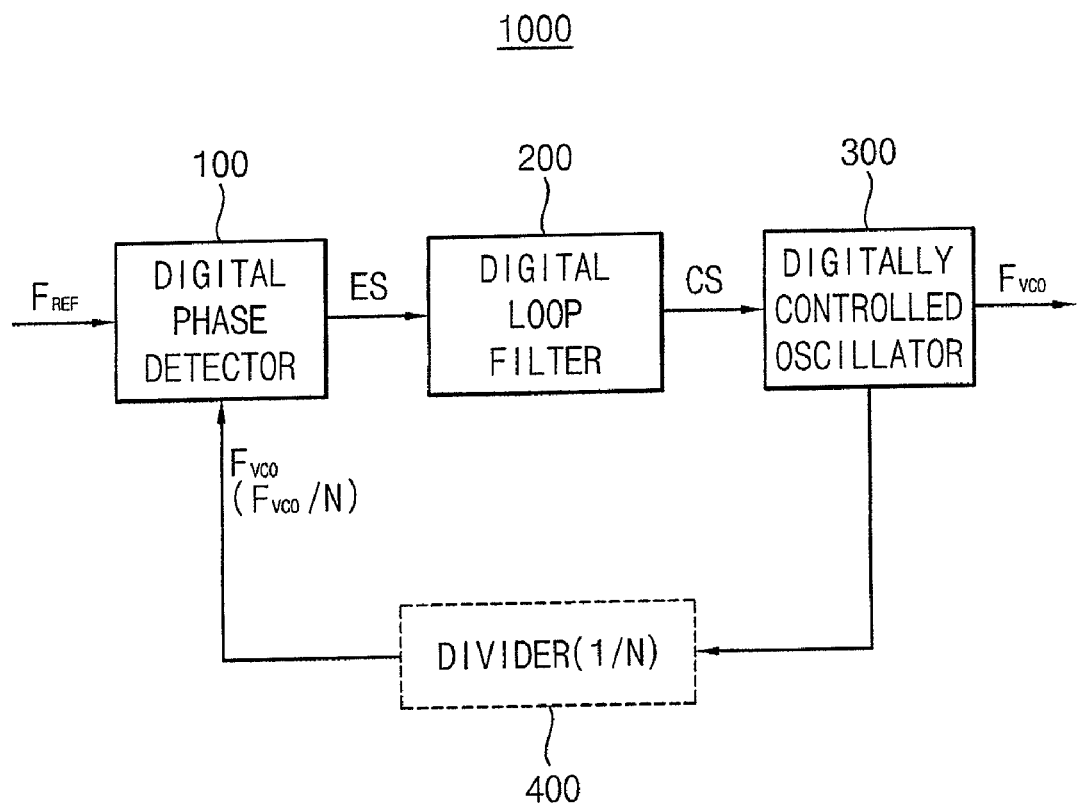
FIG. 9 is a block diagram illustrating a digital phase locked loop according to an exemplary embodiment.

FIG. 9 is a block diagram illustrating a digital phase locked loop according to an exemplary embodiment. The digital phase locked loop 1000 may include a digital phase detector 100, a digital loop filter 200, and an oscillator 300. In an exemplary embodiment the digital phase locked loop 1000 may further include a divider 400 when the frequency $F_{VCO}$ of the oscillation signal is relatively high.

The digital phase detector 100 may include a quantization unit, a first conversion unit, a second conversion unit, and a calculation unit. The quantization unit quantizes a frequency $F_{REF}$ of a reference signal to generate reference delay information and reference integer phase information, and quantizes a frequency $F_{VCO}$ of an oscillation signal to generate oscillation delay information and oscillation integer phase information. The first conversion unit converts the frequency $F_{REF}$ of the reference signal into reference frequency information based upon the reference delay information and the reference integer phase information. The second conversion unit converts the frequency $F_{VCO}$ of the oscillation signal into oscillation frequency information based upon the oscillation delay information and the oscillation integer phase information. The calculation unit converts the reference frequency information into first phase information, converts the oscillation frequency information into second phase information, and outputs a digital phase difference between the first phase information and the second phase information. That is, the digital phase detector 100 receives the frequency $F_{REF}$ of the reference signal and the frequency $F_{VCO}$ of the oscillation signal, generates an error signal ES as a digital value corresponding to the phase difference between the reference signal and the oscillation signal, and outputs the error signal ES to the digital loop filter 200.

The digital loop filter 200 generates a control signal CS for controlling the frequency $F_{VCO}$ of the oscillation signal based upon the error signal ES. That is, when the error signal ES inputted from the digital phase detector is bigger than a predetermined error tolerance range, the control signal CS controls the frequency $F_{VCO}$ of the oscillation signal generated by the oscillator 300. The oscillator 300 generates the oscillation signal having the frequency $F_{VCO}$ based upon the control signal CS. The oscillator 300 outputs the oscillation signal having the frequency $F_{VCO}$ to the outside, and to the digital phase detector 100 along a feedback path. In some embodiments, the digital phase detector 100 may receive the oscillation signal having the frequency $F_{VCO}/N$ when the digital phase locked loop 1000 includes the divider 400 that divides the frequency $F_{VCO}$ of the oscillation signal by the predetermined value (e.g., an integer N).

As described above, the digital phase locked loop 1000 includes the digital phase detector 100 capable of being implemented in small size, capable of consuming low power, and capable of detecting a phase difference between a reference signal and an oscillation signal, accurately. Thus, the digital phase locked loop 1000 may be implemented in small size, and may consume low power as well. In addition, the digital phase locked loop 1000 may lock a phase of an oscillation signal, accurately. According to an exemplary embodiment, the digital phase detector 100 and the digital phase locked loop 1000 including the digital phase detector 100 may be applied to a semiconductor circuit that uses an oscillation signal having a locked phase (frequency).

Although practical exemplary embodiments have been described, those skilled in the art will readily appreciate that many modifications to the exemplary embodiments are possible and that the exemplary embodiments, modifications to the exemplary embodiments, as well as other exemplary embodiments, are intended to be included within the scope of the appended claims.

What is claimed is:

1. A digital phase detector, comprising:
a quantization unit configured to quantize a frequency of a reference signal to generate reference delay information and reference integer phase information, and configured to quantize a frequency of an oscillation signal to generate oscillation delay information and oscillation integer phase information;
a first conversion unit configured to convert the frequency of the reference signal into reference frequency information based upon the reference delay information and the reference integer phase information;
a second conversion unit configured to convert the frequency of the oscillation signal into oscillation frequency information based upon the oscillation delay information and the oscillation integer phase information; and
a calculation unit configured to convert the reference frequency information into first phase information, configured to convert the oscillation frequency information into second phase information, and configured to output a digital phase difference between the first phase information and the second phase information,
wherein the first conversion unit generates reference fraction phase information based upon the reference delay information, and generates reference phase information by adding the reference fraction phase information to the reference integer phase information,
wherein the first conversion unit converts the frequency of the reference signal into the reference frequency information using:

$$dF_{REF}(n) = \frac{F_{OSC}}{F_{REF}} = CNT_R(n) - CNT_R(n-1) - 1 + fr_R(n) + 1 - fr_R(n-1)$$

where $dF_{REF}(n)$ denotes reference frequency information detected at (n)th rising edge, $F_{OSC}$ denotes a frequency of a clock signal, $F_{REF}$ denotes a frequency of a reference signal, $CNT_R(n)$ denotes reference integer phase information outputted at (n)th rising edge, $CNT_R(n-1)$ denotes reference integer phase information outputted at (n-1)th rising edge, $fr_R(n)$ denotes reference fraction phase information outputted at (n)th rising edge, and $fr_R(n-1)$ denotes reference fraction phase information outputted at (n-1)th rising edge.

2. The digital phase detector of claim 1, wherein the quantization unit comprises:
a ring oscillator configured to generate a reference passing signal, an oscillation passing signal, and a clock signal based upon the reference signal and the oscillation signal;
a first latch block configured to generate the reference delay information based upon the reference signal and the reference passing signal;
a second latch block configured to generate the oscillation delay information based upon the oscillation signal and the oscillation passing signal; and
a counter block configured to count the clock signal to generate the reference integer phase information and the oscillation integer phase information.

3. The digital phase detector of claim 1, wherein the first conversion unit comprises:
a first edge detection block configured to generate a reference position signal based upon the reference delay information;
a first encoder block configured to generate the reference fraction phase information based upon the reference position signal;
a first adder block configured to generate the reference phase information by adding the reference fraction phase information to the reference integer phase information; and
a first differentiation block configured to perform a differentiation operation on the reference phase information to generate the reference frequency information.

4. A digital phase detector, comprising:
a quantization unit configured to quantize a frequency of a reference signal to generate reference delay information and reference integer phase information, and configured to quantize a frequency of an oscillation signal to generate oscillation delay information and oscillation integer phase information;
a first conversion unit configured to convert the frequency of the reference signal into reference frequency information based upon the reference delay information and the reference integer phase information;
a second conversion unit configured to convert the frequency of the oscillation signal into oscillation frequency information based upon the oscillation delay information and the oscillation integer phase information; and
a calculation unit configured to convert the reference frequency information into first phase information, configured to convert the oscillation frequency information into second phase information, and configured to output a digital phase difference between the first phase information and the second phase information,
wherein the second conversion unit generates oscillation fraction phase information based upon the oscillation delay information, and generates oscillation phase information by adding the oscillation fraction phase information to the oscillation integer phase information,
wherein the second conversion unit converts the frequency of the oscillation signal into the oscillation frequency information using:

$$dF_{VCO}(n) = \frac{F_{OSC}}{F_{VCO}} = CNT_V(n) - CNT_V(n-1) - 1 + fr_V(n) + 1 - fr_V(n-1)$$

where $dF_{VCO}(n)$ denotes oscillation frequency information detected at (n)th rising edge, $F_{OSC}$ denotes a frequency of a clock signal, $F_{VCO}$ denotes a frequency of an oscillation signal, $CNT_V(n)$ denotes oscillation integer phase information outputted at (n)th rising edge, $CNT_V(n-1)$ denotes oscillation integer phase information outputted at (n-1)th rising edge, $fr_V(n)$ denotes oscillation fraction phase information outputted at (n)th rising edge, $fr_V(n-1)$ denotes oscillation fraction phase information outputted at (n-1)th rising edge.

5. The digital phase detector of claim 4, wherein the second conversion unit comprises:
a second edge detection block configured to generate an oscillation position signal based upon the oscillation delay information;
a second encoder block configured to generate the oscillation fraction phase information based upon the oscillation position signal;
a second adder block configured to generate the oscillation phase information by adding the oscillation fraction phase information to the oscillation integer phase information; and
a second differentiation block configured to perform a differentiation operation on the oscillation phase information to generate the oscillation frequency information.

6. A digital phase detector, comprising:
a quantization unit configured to quantize a frequency of a reference signal to generate reference delay information and reference integer phase information, and configured to quantize a frequency of an oscillation signal to generate oscillation delay information and oscillation integer phase information;
a first conversion unit configured to convert the frequency of the reference signal into reference frequency information based upon the reference delay information and the reference integer phase information;
a second conversion unit configured to convert the frequency of the oscillation signal into oscillation frequency information based upon the oscillation delay information and the oscillation integer phase information; and
a calculation unit configured to convert the reference frequency information into first phase information, configured to convert the oscillation frequency information into second phase information, and configured to output a digital phase difference between the first phase information and the second phase information,
wherein the calculation unit comprises:
a first integration block configured to convert the reference frequency information into the first phase information by performing an integration operation on the reference frequency information;
a second integration block configured to convert the oscillation frequency information into the second phase information by performing an integration operation on the oscillation frequency information; and
a calculation block configured to calculate the digital phase difference between the first phase information and the second phase information.

7. The digital phase detector of claim 6, wherein the first integration block converts the reference frequency information into the first phase information using:

$$dP_{REF} = \int dF_{REF}(n)$$

where $dP_{REF}$ denotes first phase information, and $dF_{REF}(n)$ denotes reference frequency information detected at (n)th rising edge.

8. The digital phase detector of claim 6, wherein the second integration block converts the oscillation frequency information into the second phase information using:

$$dP_{VCO} = \int dF_{VCO}(n)$$

where $dP_{VCO}$ denotes second phase information, and $dF_{VCO}(n)$ denotes oscillation frequency information detected at (n)th rising edge.

9. The digital phase detector of claim 6, wherein the calculation block calculates the digital phase difference using:

$$dP_{err} = dP_{REF} - dP_{VCO}$$

where $dP_{err}$ denotes a digital phase difference between a first phase information and a second phase information, $dP_{REF}$ denotes first phase information, and $dP_{VCO}$ denotes second phase information.

10. The digital phase detector of claim 9, wherein the calculation block calculates a plurality of digital phase differences between the first phase information and a plurality of consecutive second phase information, and selects an optimum digital phase difference among the digital phase differences.

11. The digital phase detector of claim 10, wherein the calculation block comprises:
a phase difference generator configured to generate a first through n(th) digital phase difference by performing a subtraction operation between the first phase information and the consecutive second phase information;
a controller configured to output an optimum digital phase difference selection signal for selecting the optimum digital phase difference among the first through n(th) digital phase difference; and
a multiplexer configured to output the optimum digital phase difference based upon the optimum phase difference selection signal.

12. A digital phase locked loop, comprising:
a digital phase detector configured to generate an error signal based upon a frequency of a reference signal and a frequency of an oscillation signal;
a digital loop filter configured to generate a control signal for controlling the frequency of the oscillation signal based upon the error signal; and
an oscillator configured to generate the oscillation signal based upon the control signal, wherein the digital phase detector comprises:
  a quantization unit configured to quantize the frequency of the reference signal to generate reference delay information and reference integer phase information, and configured to quantize the frequency of the oscillation signal to generate oscillation delay information and oscillation integer phase information;
  a first conversion unit configured to convert the frequency of the reference signal into reference frequency information based upon the reference delay information and the reference integer phase information;
  a second conversion unit configured to convert the frequency of the oscillation signal into oscillation frequency information based upon the oscillation delay information and the oscillation integer phase information; and
  a calculation unit configured to convert the reference frequency information into first phase information, configured to convert the oscillation frequency information into second phase information, and configured to output a digital phase difference between the first phase information and the second phase information, the digital phase difference corresponding to the error signal,
wherein the first conversion unit comprises:
  a first edge detection block configured to generate a reference position signal based upon the reference delay information;
  a first encoder block configured to generate a reference fraction phase information based upon the reference position signal;
  a first adder block configured to generate the reference phase information by adding the reference fraction phase information to the reference integer phase information; and
  a first differentiation block configured to perform a differentiation operation on the reference chase information to generate the reference frequency information,
wherein the calculation unit comprises:
  a first integration block configured to convert the reference frequency information into the first phase information by performing an integration operation on the reference frequency information;
  a second integration block configured to convert the oscillation frequency information into the second phase information by performing an integration operation on the oscillation frequency information; and
  a calculation block configured to calculate the digital phase difference between the first phase information and the second phase information.

13. The digital phase locked loop of claim 12, further comprising:
a divider configured to divide the frequency of the oscillation signal that is outputted from the oscillator to the digital phase detector by a predetermined value.

14. The digital phase locked loop of claim 12, wherein the quantization unit comprises:
a ring oscillator configured to generate a reference passing signal, an oscillation passing signal, and a clock signal based upon the reference signal and the oscillation signal;
a first latch block configured to generate the reference delay information based upon the reference signal and the reference passing signal;
a second latch block configured to generate the oscillation delay information based upon the oscillation signal and the oscillation passing signal; and
a counter block configured to count the clock signal to generate the reference integer phase information and the oscillation integer phase information.

15. The digital phase locked loop of claim 12, wherein the second conversion unit comprises:
a second edge detection block configured to generate an oscillation position signal based upon the oscillation delay information;
a second encoder block configured to generate an oscillation fraction phase information based upon the oscillation position signal;
a second adder block configured to generate the oscillation phase information by adding the oscillation fraction phase information to the oscillation integer phase information; and
a second differentiation block configured to perform a differentiation operation on the oscillation phase information to generate the oscillation frequency information.

* * * * *